(12) United States Patent
Polishchuk et al.

(10) Patent No.: US 8,780,073 B2
(45) Date of Patent: Jul. 15, 2014

(54) CAPACITIVE SENSOR ARRANGEMENT

(75) Inventors: Igor Polishchuk, Fremont, CA (US);
Vasyl Mandziy, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 315 days.

(21) Appl. No.: 13/114,153

(22) Filed: May 24, 2011

(65) Prior Publication Data

US 2012/0044197 A1 Feb. 23, 2012

Related U.S. Application Data

(60) Provisional application No. 61/347,581, filed on May 24, 2010.

(51) Int. Cl.
G06F 3/045 (2006.01)
G01R 27/26 (2006.01)
G06F 3/044 (2006.01)

(52) U.S. Cl.
CPC ...... *G06F 3/044* (2013.01); *G06F 2203/04111* (2013.01); *G06F 2203/04103* (2013.01)
USPC .......................................................... 345/174

(58) Field of Classification Search
USPC .................................. 345/173–178; 324/686
See application file for complete search history.

(56) References Cited

U.S. PATENT DOCUMENTS

| 2008/0211754 | A1* | 9/2008 | Park et al. ........................ 345/87 |
| 2009/0315853 | A1* | 12/2009 | Yang et al. ..................... 345/174 |
| 2010/0079384 | A1* | 4/2010 | Grivna ........................... 345/173 |

* cited by examiner

*Primary Examiner* — Andrew Sasinowski

(57) ABSTRACT

An example capacitive sensor arrangement includes an integrated member residing within an interior region of a capacitive sensor element. The capacitive sensor element has a first resistance to a flow of current and the integrated member has a second resistance to the flow of current that is less than the first resistance.

18 Claims, 13 Drawing Sheets

| EXAMPLE ARRANGEMENT | ESTIMATED RESISTANCE IN SQUARES |
|---|---|
| 702 | 3.91 |
| 704 | 0.47 |
| 706 | 0.53 |
| 708 | 0.41 |

*FIG. 7*

CAPACITIVE SENSOR ARRANGEMENT

RELATED APPLICATIONS

This application claims the priority benefit of U.S. Provisional Application No. 61/347,581, filed May 24, 2010, which is incorporated herein by reference.

TECHNICAL FIELD

The subject matter disclosed herein relates to the field of sensors. More specifically, the subject matter relates to capacitive sensor technology.

BACKGROUND

Computing devices, such as notebook computers, personal digital assistants, mobile communication devices, portable entertainment devices (e.g., handheld video game devices, multimedia players), and set-top-boxes (e.g., digital cable boxes, digital video disc (DVD) players) may include user interface devices that facilitate interaction between a user and the computing device.

One type of user interface device that has become more common is a touch-sensor device or touch input device that operates by way of capacitance sensing. A touch-sensor device may be in the form of a touchscreen, touch-sensor pad, a touch-sensor slider, or touch-sensor buttons, and may include an array of one or more capacitive sensor elements. Capacitive sensing typically involves measuring a change in capacitance associated with the capacitive sensor elements to detect a presence of a conductive object. A capacitance detected by a capacitive sensor may vary depending on proximity of a conductive object relative to the touch-sensor device. The conductive object may be, for example, a stylus or a user's finger.

Capacitive sensing may include a scan operation in which an electrical signal (e.g., a current) may be generated and/or measured to detect any change of capacitance associated with the capacitive sensor elements. Such scan operations may be characterized by performance metrics such as scan-time and power consumption.

BRIEF DESCRIPTION OF THE DRAWINGS

Some embodiments are illustrated by way of example and not limitation in the figures of the accompanying drawings in which:

FIG. 7 is a chart showing various integrated member geometries and corresponding estimated resistances, in accordance with various embodiments;

DETAILED DESCRIPTION

In the following description, for purposes of explanation, numerous specific details are set forth in order to provide a thorough understanding of embodiments. It will be evident to one skilled in the art that the claimed subject matter may be practiced without these specific details.

Particular embodiments are briefly overviewed, and then those and other embodiments are described in more detail with respect to the figures. In some embodiments, a touchscreen includes capacitive sensor elements that may be scanned to detect a conductive object providing input to the surface of the touchscreen. Scanning performance may be characterized by the amount of time and energy it takes to scan the capacitive sensor elements. Embodiments include a capacitive sensor arrangement that is an integration of a capacitive sensor element with an integrated member. Generally, with a touchscreen, a user may apply input using a finger, a stylus, or other conductive object. To detect the input, in various embodiments, an integrated capacitive sensor arrangement that is an integration of a capacitive sensor element with an integrated member, may be scanned with less delay and less energy consumption than would be realized in scanning the capacitive sensor element by itself. Embodiments described herein illustrate how the capacitive sensor arrangements may be used in a single layer capacitive sensor matrix and/or a multiple layered capacitive sensor matrix.

An example capacitive sensor arrangement may include an integrated member residing within an interior region of a capacitive sensor element. The integrated member may have a lower resistance to a flow current (e.g., a current of a scanning operation) than a higher resistance to the flow of current of the capacitive sensor element. The lower resistance path provided by the integrated member may reduce an overall resistance to scanning current across the capacitive sensor element integrated with the integrated member. This reduced resistance may consequently reduce scanning delay, heat dissipation, and power consumption in scanning capacitive sensor elements of a touchscreen.

The detailed description includes references to the accompanying drawings, which form a part of the detailed description. The drawings show illustrations in accordance with embodiments. These embodiments, which are also referred to herein as "examples," are described in enough detail to enable those skilled in the art to practice embodiments of the claimed subject matter described herein. The embodiments may be combined, other embodiments may be utilized, or structural, logical, and electrical changes may be made without departing from the scope and spirit of what is claimed. The following detailed description is not to be taken in a limiting sense as the scope of the subject matter to be patented is defined by the appended claims and their equivalents.

Figure 1:
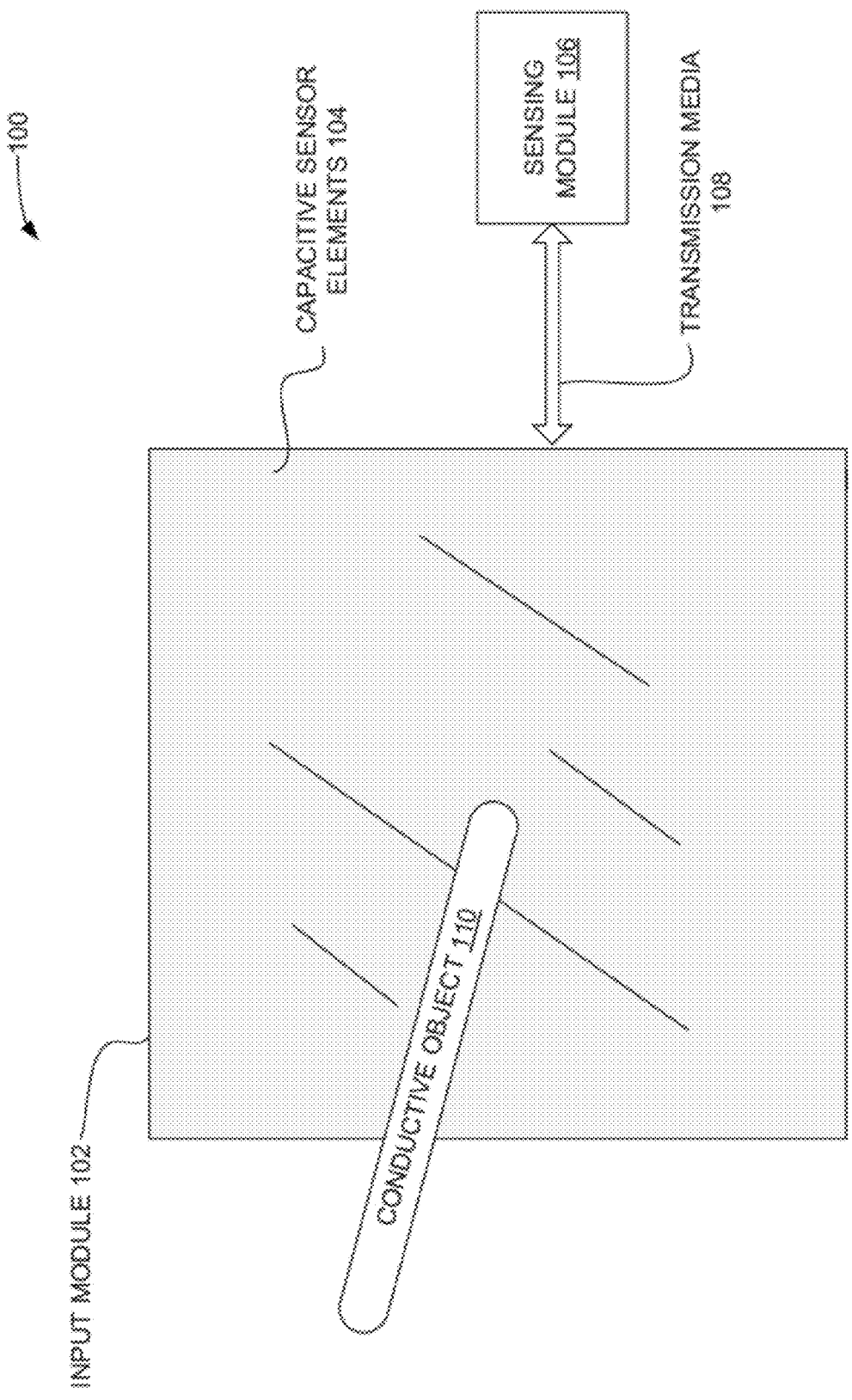
FIG. 1 is a block diagram illustrating an example capacitive sensing system, in accordance with various embodiments.

FIG. 1 is a block diagram illustrating an example capacitive sensing system 100, in accordance with various embodiments. The capacitive sensing system 100 is shown to include an input module 102 coupled to a sensing module 106. A conductive object 110 is shown to interact with the capacitive sensing system 100. The capacitive sensing system 100 is to detect the presence of the conductive object 110.

In various embodiments, the capacitive sensing system 100 may provide the functionality of a touchscreen, a touchpad, a slider, a button, a switch, a level sensor, a proximity sensor, a displacement sensor, a combination thereof, or provide some other functionality based on a detected presence of the conductive object.

The input module 102 is to receive input from the conductive object 110. The input module 102 is shown to include capacitive sensor elements 104. A capacitance associated with a capacitive sensor element (e.g., of the capacitive sensor elements 104) may be affected by the presence of the conductive object 110. As discussed further below, the sensing module 106 may measure the capacitance (e.g., in a scan operation) to detect the presence of the conductive object 110. In various embodiments, the capacitive sensor elements 104, as integrated with integrated members (not shown, discussed below), allow for faster scanning speeds and reduced power consumption associated with scanning of the capacitive sensor elements 104.

In some embodiments, the input module 102 may include a touch pad, a touchscreen, or any other interface to receive input from the conductive object 110. In various embodiments, the input module 102 may employ projected capacitive technology in which the capacitive sensor elements 104 are formed in one or more capacitive sensor layers upon a substrate (not shown) of the input module 102. For example, the capacitive sensor elements 104 may be patterned in one or more layers of transparent conducting film deposited on a glass substrate. A protective transparent layer (e.g., glass or plastic film) may cover the capacitive sensor elements to avoid environmental damage to them.

The conductive object 110 is to provide input to the input module 102. The conductive object may include any object that affects a capacitance associated with the capacitive sensor elements 104. Examples of the conductive object 110 may include, but not be limited to, a finger or a stylus.

The conductive object 110 may be fixed in position or moveable in position relative to the input module 102. For example, a user may move the conductive object 110 relative to the input module 102. The user may include a human, a mechanism, a machine, and/or instructions. Alternatively or additionally, the input module 102 may be allowed to move relative to a fixed or movable conductive object 110.

The sensing module 106 is to sense whether the conductive object 110 is proximate to or in contact with any of the capacitive sensor elements 104 of the input module 102. To this end, the sensing module 106 may sense the effect of the conductive object 110 on a capacitance associated with the capacitive sensor elements 104.

In one embodiment, the sensing module 106 senses the conductive object 110 through comparing a capacitance of a capacitive sensor element when the conductive object 110 is not present (e.g., not proximate to or in contact with a capacitive sensor element), with the capacitance of the capacitive sensor element when the conductive object 110 is present. For some embodiments, to sense the presence of the conductive object 110, the sensing module 106 may perform a scan operation in which each of the capacitive sensor elements 104 are scanned for a change in capacitance.

In the scan operation, the sensing module 106 may exchange energy (e.g., through current) with the input module 102 through the transmission media 108. The transmission media 108 may include any medium through which the energy may be conveyed. For some embodiments, the transmission media 108 includes metal trace (e.g., copper wire) over which current can flow. Alternatively or additionally, the energy may be propagated over a wireless transmission media.

In one embodiment of a scan operation, the sensing module 106 may apply a current to one or more of the capacitive sensor elements 104 over the transmission media 108 to form a capacitance. The sensing module 106 may alternatively or additionally receive from one or more of the capacitive sensor elements 104 a current resulting from a discharge of the one or more of the capacitive sensor elements 104. Among various scan operation embodiments, the scan-time and energy consumption associated with scan operations are affected by the resistance values and capacitance values of the capacitive sensor elements 104.

In various embodiments, the sensing module 106 may measure a self-capacitance of the capacitive sensor elements 104 and/or a mutual capacitance of the capacitive sensor elements 104. Self-capacitance and mutual capacitance of capacitive sensor elements 104 are discussed in more detail below.

For some embodiments, the sensing module 106 may process detection data (e.g., the sensed changes in capacitance associated with a capacitive sensor) through executing instructions and/or circuitry to determine positional information of the conductive object 110 relative to the input module 102. For example, the sensing module 106 may use the detection data to determine proximity, position, displacement, movement, and/or to provide other presence related measurements associated with the conductive object 110. Alternatively or additionally, the sensing module 106 may provide the detection data to other instructions and/or circuitry (e.g., instructions and/or circuitry of a host) to determine the proximity or positional information of the conductive object 110.

Figure 2:
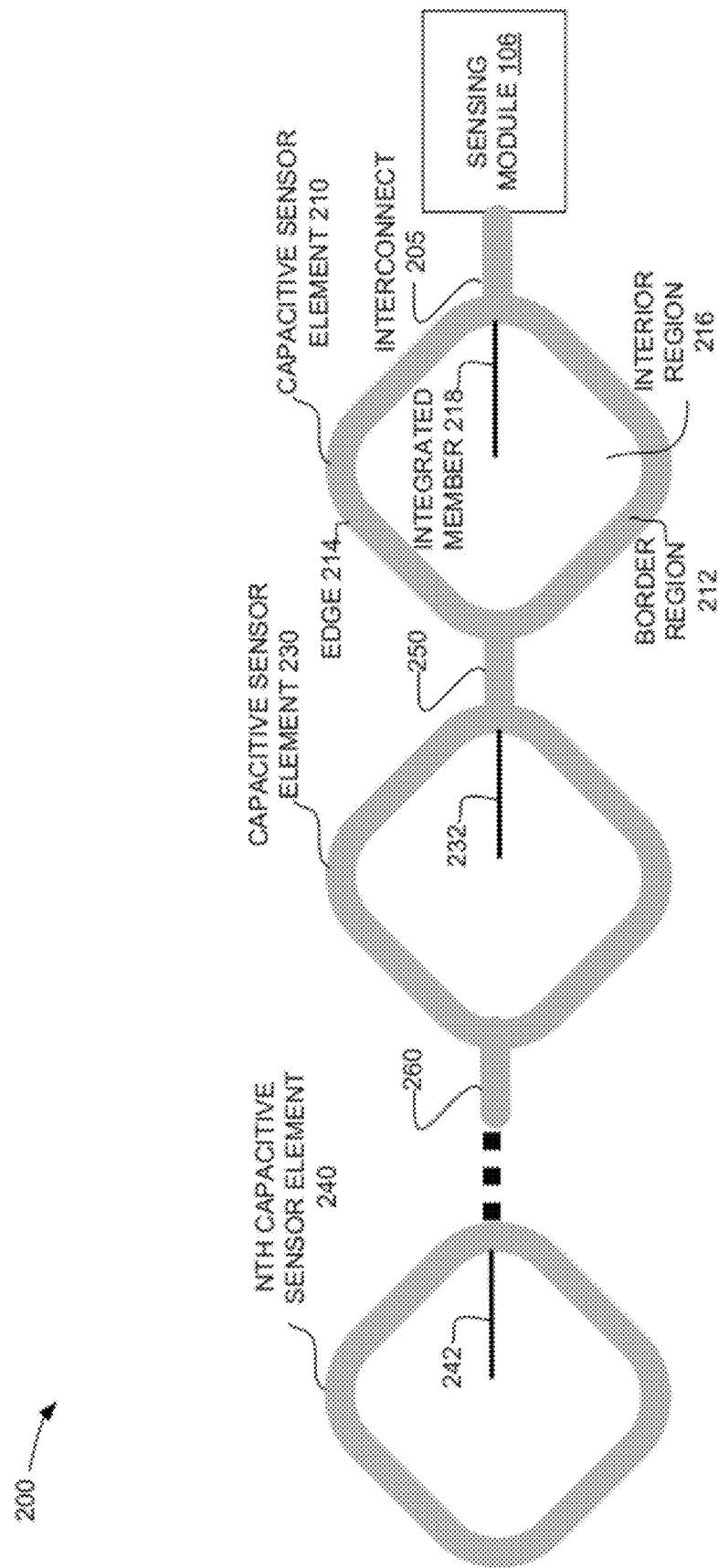
FIG. 2 is block diagram illustrating capacitive sensor elements integrated with integrated members, in accordance with various embodiments.

Embodiments of capacitive sensor elements 104, as integrated with integrated members, are described in more detail with respect to FIG. 2.

FIG. 2 is a block diagram 200 illustrating capacitive sensor elements 210, 230, and 240 integrated with integrated members 218, 232, and 242, respectively, in accordance with various embodiments. The capacitive sensor elements 210, 230, and 240 are shown to be connected in series with the sensing module 106 through the interconnects 205, 250, and 260. The $N^{th}$ capacitive sensor element 240 represents a last capacitive sensor element in the series and may be preceded in the series by any number of other capacitive sensor elements and interconnects.

As introduced above, a capacitance of a capacitive sensor element may be measured by the sensing module 106 to detect the presence of the conductive object 110 of FIG. 1. In various embodiments, each capacitive sensor element 210, 230, and 240 may behave as a capacitive plate that forms the capacitance to be measured. The capacitance to be measured may include a self-capacitance and/or a mutual capacitance. Taking the capacitive sensor element 210 as an example, a self-capacitance of the capacitive sensor element may include a capacitance formed between the capacitive sensor elements 210 and a reference voltage such as ground (not shown). A mutual capacitance of the capacitive sensor elements 210 may include a capacitance formed between the capacitive sensor element 210 and one or more other conductive objects (not shown) that are electrically insulated from the capacitive sensor element 210.

In an example scan operation, the sensing module 106 applies a flow of current through each capacitive sensor element 210, 230, and 240 in the series to form capacitances associated with each capacitive sensor element 210, 230, and 240. Applying this current may be referred to as driving the capacitive sensor elements 210, 230, and 240. The sensing module 106 may alternatively or additionally receive a flow of current resulting from a discharge associated with each capacitive sensor element 210, 230, and 240. This receiving of the flow of current may be referred to as sensing the capacitive sensor elements 210, 230, and 240. In either case, the flow of current traversing the series of capacitive sensor elements 210, 230, and 240 is conducted by the interconnects 205, 250, and 260, the capacitive sensor elements 210, 230, and 240, and the integrated members 218, 232, and 242.

Although the capacitive sensor elements 210, 230, and 240 are shown to be shaped as diamonds oriented along a horizontal axis, the capacitive sensor elements 210, 230, and 240 may be formed in other shapes and oriented along other axes or curves without departing from the claimed subject matter. In various embodiments, the capacitive sensor elements 210, 230, and 240 may be formed from a transparent conducting film such as indium tin oxide (ITO)). Other appropriate transparent conducting films may be used to form the capacitive sensor elements without departing from the claimed subject matter.

The capacitive sensor element 210 is shown to include a border region 212 an edge 214 and an internal region 216. Features described with reference to the capacitive sensor element 210, the border region 212, the edge 214, and the internal region 216 may be applicable to the capacitive sensor elements 230 and 240 and their similarly defined border regions, edges, and the internal regions (not shown).

The border region 212 may define a border between at least a portion of the interior region 216 and the edge 214 of the capacitive sensor element 210. The border region 212 is shown to include surface area and/or volume of the capacitive sensor element 210 of the surrounding edge 214 of the capacitive sensor element 210. The internal region 216 may include a surface area or volume of the capacitive sensor element that is internal to the edge 214 of the capacitive sensor element 210. For some embodiments, a portion of the internal region 216 may overlap with a portion of the border region 212. In an embodiment, the edge 214 of the capacitive sensor element 210 includes a surface area of the capacitive sensor element 210.

In various embodiments, the integrated members 218, 232, and 242 may be the same or similar to one another. Features are described with reference to the integrated member 218 but the description may be applicable to the other integrated members 232 and 242. The integrated member 218 is to reduce an overall resistance to a flow of current (e.g., the current of a scan operation) traversing the capacitive sensor element 210 compared to a higher resistance that would exist without the integration of the integrated members 218. Further explanation on how this reduction in resistance is achieved is discussed in more detail with respect to FIGS. 3 and 4.

The integrated member 218 may made from a material and arranged such that it has a lower resistance to current than a resistance to current of the capacitive sensor element 210 material and arrangement. For example, the integrated member 218 may include a thin metal strip (e.g., copper) with a lower resistivity than that of the capacitive sensor element 210 (e.g., diamond shaped) made from a transparent conducting film (e.g., ITO).

The integrated member 218 may reside within the interior region 216 of the capacitive sensor element 210. In FIG. 2, the integrated member 218 is shown to extend from the border region 212 to the internal region 216. In some embodiments, the integrated member 218 may reside entirely within the internal region 216 and may not lie within or contact the border region 212. For some embodiments, the integrated member 218 is coupled to a surface area (e.g., through overlaying or deposition) of the interior region 216 of the capacitive sensor element 210. Alternatively or additionally, the integrated member 218 may reside within a volume (e.g., through injection, embedding, mixing, or the like) of the internal region 216. For some embodiments, the integrated member 218 is coupled to a surface area of the capacitive sensor element 210 along the edge 214 of the capacitive sensor element 210.

The naked eye of a typical human user can visually perceive objects having a width of around 20 micrometers and larger. The integrated member 218 may be so thin that it is visually imperceptible to the naked eye of the user. For example, when the capacitive sensor elements 210, 230, and 240 are used in a touchscreen, the user will not be able to distinguish the integrated members 218, 232, and 242 from the capacitive sensor elements 210, 230, and 240 made from ITO. For some embodiments, the integrated members 218, 232, and 242 have a width no larger than 8 micrometer (e.g., around 6 micrometers).

The interconnects 205, 250, and 260 may couple the capacitive sensor elements 210, 230, and 240 with the sensing module 106 either directly or through further capacitive sensor elements (not shown) to allow current to flow between the sensing module 106 and one or more of the capacitive sensor elements 210, 230, and 240.

For some embodiments, the interconnects 205, 250, and 260 and the capacitive sensor elements 210, 230, and 240 may be part of a contiguous mass that resides in a common layer or plane. For example, a pattern including the capacitive sensor elements 210, 230, and 240 and the interconnects 205, 250, and 260 may be etched from the same transparent conductive layer (e.g. ITO disposed on a non-conductive substrate).

In some embodiments, the interconnects 205, 250, and 260, and the capacitive sensor elements 210, 230, and 240 may be separate components rather than a contiguous mass. For example, a pattern including the capacitive sensor elements 210, 230, and 240 may be etched from a transparent conducting layer and the interconnects 205, 250, and 260 may be separately formed on (e.g., on top or on the bottom) the capacitive sensor pattern to electrically couple the capacitive sensor elements 210, 230, and 240 to one another in series. In such embodiments, the interconnects 205, 250, and 260 may made from a material having a lower resistance to current than a resistance to current of the material making up the capacitive sensor elements 210, 230, and 240.

For some embodiments, the interconnects 205, 250, and 260 and the integrated members 218, 232, and 242 are all made from the material having the lower resistance to current than the material making up the capacitive sensor elements 210, 230, and 240. Such an arrangement provides an overall lower resistance to current (e.g., current of a scan operation) compared to arrangements with higher resistance components. As noted above, capacitance and resistance values associated with the capacitive sensor elements 210, 230, and 240 affect scan-time and power consumption in scan operations. These capacitance and resistance values are now discussed.

Figure 3:
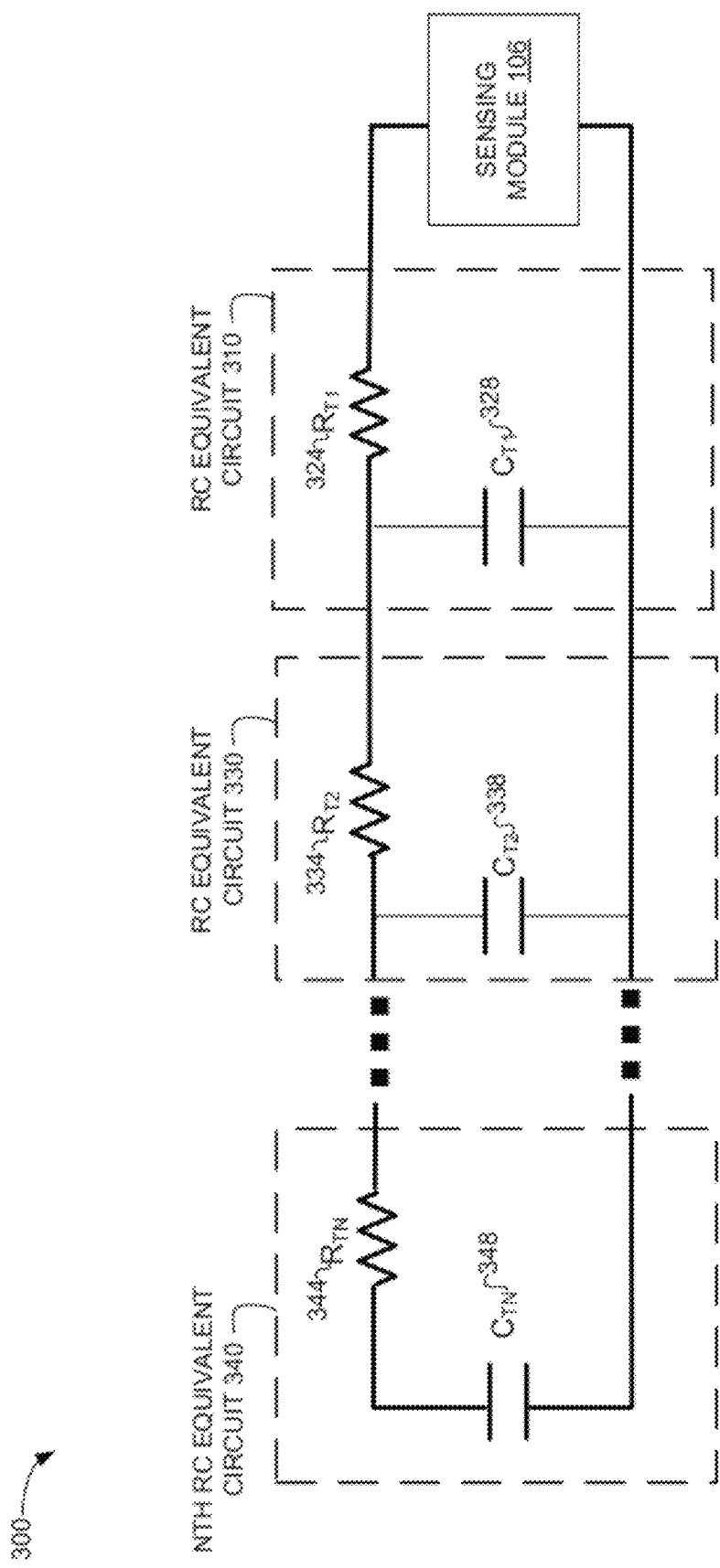
FIG. 3 is a circuit diagram illustrating an example resistor-capacitor (RC) network circuit for the capacitive sensor elements of FIG. 2, in accordance with various embodiments.

FIG. 3 is a circuit diagram illustrating an example resistor-capacitor (RC) network circuit 300 for the capacitive sensor elements 210, 230, and 240 integrated with integrated members 218, 232, and 242, respectively, of FIG. 2, in accordance with various embodiments.

The RC network circuit 300 is shown to include the sensing module 106 coupled to an RC equivalent circuit 310, which with respect to FIG. 2, represents the electrical behavior of the interconnect 205 and the capacitive sensor element 210 integrated with the integrated members 218. The RC network circuit 300 is further shown to include an RC equivalent circuit 330, which with respect to FIG. 2, represents electrical behavior of the interconnect 250 and the capacitive sensor element 230 integrated with the integrated member 232. The RC network circuit 300 is yet further shown to include an $N^{th}$ RC equivalent circuit 340, which with respect to FIG. 2, represents electrical behavior of the interconnect 260 and the capacitive sensor element 240 integrated with the integrated member 242. The $N^{th}$ RC equivalent circuit 340 that represents a last RC equivalent circuit of the series and may be preceded by any number of other RC equivalent circuits.

The RC equivalent circuit 310 is shown to include a resistor having a resistance $R_{T1}$ 324 coupled with a capacitor having a capacitance $C_{T1}$ 328. The RC equivalent circuit 330 is shown to include a resistor having a resistance $R_{T2}$ 334 coupled with a capacitor having a capacitance $C_{T2}$ 338. The RC equivalent circuit 340 is shown to include a resistor having a resistance $R_{TN}$ 344 coupled with a capacitor having a capacitance $C_{TN}$ 348. The operation and behavior of the RC equivalent circuit 310 may be representative of the operation and behavior of the RC equivalent circuits 330 and 340. Thus, example RC equivalent circuit 310 described below may also describe some embodiments of the RC equivalent circuits 330 and 340.

Figure 4:
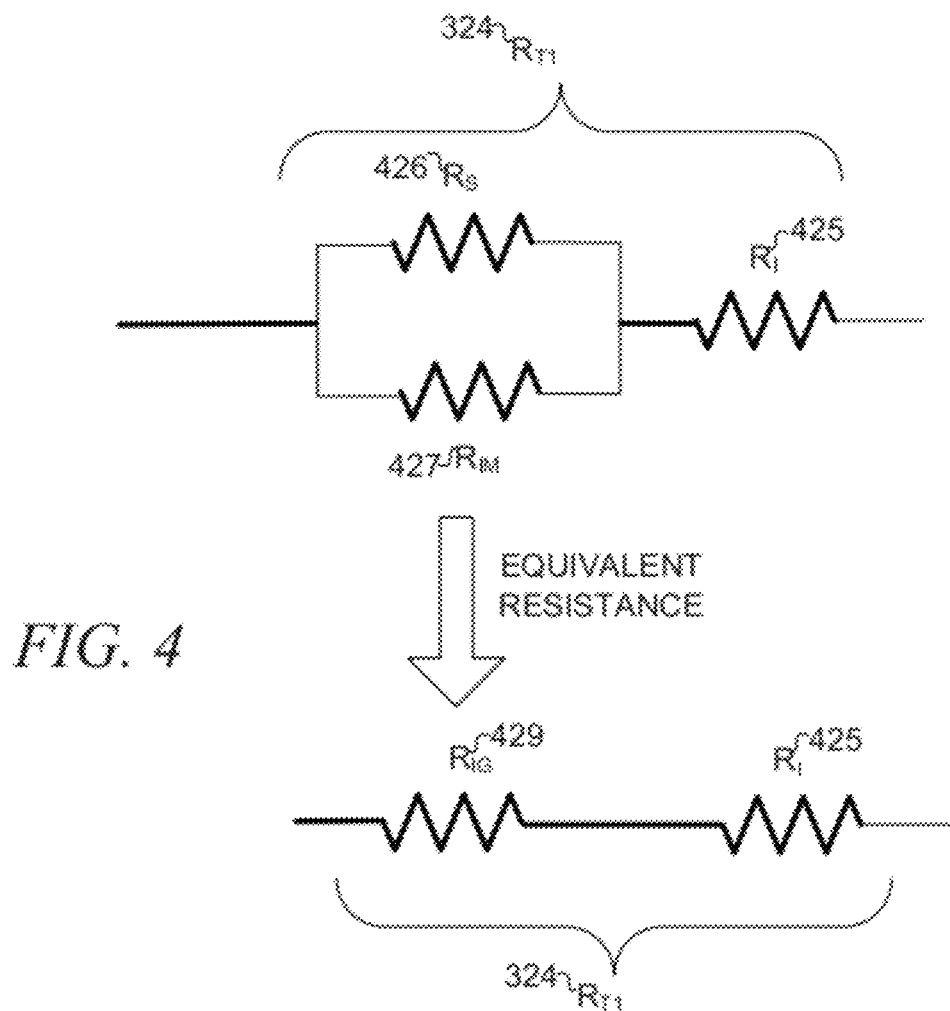
FIG. 4 shows portions of circuit diagrams illustrating different components of resistance, in accordance with an embodiment

Referring to the RC equivalent circuit 310 of FIG. 3, the resistance $R_{T1}$ 324 represents multiple resistive components. FIG. 4 shows portions of circuit diagrams illustrating different components of the resistance $R_{T1}$ 324 of FIG. 3, in accordance with an embodiment. Referring to FIG. 4, the resistive components of $R_{T1}$ 324 include a resistor having a resistance $R_I$ 425 coupled to resistors in parallel having resistances $R_S$ 426 and $R_{IM}$ 427. The resistance $R_I$ 425 represents a resistance of the interconnect 205 of FIG. 2, the resistance $R_S$ 426 represents a resistance of the capacitive sensor element 210 of FIG. 2, and the resistance $R_{IM}$ 427 represents a resistance of the integrated member 218 of FIG. 2.

An equivalent parallel resistance of the parallel resistors $R_S$ 426 and $R_{IM}$ 427 may be represented as an integrated resistance $R_{IG}$ 429. For example, the integrated resistance $R_{IG}$ 429 can be expressed as $$R_{IG} = \frac{R_S R_{IM}}{R_S + R_{IM}}. \tag{1}$$

As can be seen in equation (1), when the resistance of the integrated member $R_{IM}$ 427 is less than the resistance of the capacitive sensor element $R_S$ 426, the integrated resistance $R_{IG}$ 429 will be less than the resistance $R_S$ 426. Referring to FIG. 4, the resistance $R_{T1}$ 324 is the sum of the integrated resistance $R_{IG}$ 429 in series with the resistance $R_I$ 425. Thus, integrating the integrated member 218 with the capacitive sensor element 210 results in a reduced resistance $R_{T1}$ 324 of FIG. 3 that is less than would be realized without integrating the integrated member. It will be noted that the reduced resistances $R_{T2}$ 334 and $R_{TN}$ 344 may similarly be realized through integrating the capacitive sensor elements 230 and 240 of FIG. 2 with integrated members 232 and 242, respectively.

Returning to FIG. 3, the capacitance $C_{T1}$ 328 of the RC equivalent circuit 310 may represent multiple capacitive components. For example, the capacitance $C_{T1}$ 328 can represent a self-capacitances of the capacitive sensor element 210 and the interconnect 205 of FIG. 2, and/or mutual capacitances of the capacitive sensor element 210 and the interconnect 205. The mutual capacitance may include a parasitic capacitance component that, in some embodiments, may be detected or measured but not used in detecting a conductive object. An embodiment for minimizing parasitic capacitance associated with interconnects is discussed below with respect to FIGS. 11 and 12.

In the example scan operation introduced above with respect to FIG. 2, there may be a delay in the propagation of current conducted through the series of capacitive sensor elements 210, 230, and 240. For example, the propagation delay may include the time it takes in a scan operation for a current signal applied by the sensing module 106 to arrive at the $N^{th}$ capacitive sensor element 240 through the interconnects 205, 250, and 260.

The Elmore delay equation may be used to approximate the delay in the propagation of current up to a selected RC equivalent circuit of the RC network circuit 300. As applied to the embodiment of FIG. 3, the delay equation may be expressed as $$\tau = R_{T1}C_{T1} + (R_{T1}+R_{T2})C_{T2} + \ldots (R_{T1}+R_{T2}+\ldots R_{TN})C_{TN} \tag{2},$$

where $\tau$ is an estimation of the propagation delay from the sensing module 106 to a selected RC equivalent circuit less that the $N^{th}$ RC equivalent circuit 340.

As can be seen from equation (2), smaller resistances and/or capacitances in the RC network circuit 300 will result in reduced propagation delay, $\tau$. Compared to a capacitive sensor element without an integrated member, the capacitive sensor integrated with the integrated member provides the smaller resistance that will result in the reduced propagation delay, $\tau$.

Again, taking the capacitive sensor element 210 integrated with the integrated member 218 of FIG. 2 as an example, the corresponding resistance $R_{T1}$ 324 of FIGS. 3 and 4 is the sum of the resistance $R_{IG}$ 429 in series with the resistance $R_I$ 425 of FIG. 4. The resistance $R_{IG}$ 429 is equivalent to the resistance $R_S$ 426 of FIG. 4 in parallel with the resistance $R_{IM}$ 427 of FIG. 4. As explained with respect to FIG. 4, when the resistance $R_{IM}$ 427 is less than the resistance $R_S$ 426, the equivalent parallel resistance $R_{IG}$ will be less than the resistance $R_S$ 426. Thus, the resistance $R_{T1}$ 324 of FIG. 3 is made smaller through integration of the integrated member 218 with the capacitive sensor element 210 of FIG. 2. It will be noted that the reduced resistances $R_{T2}$ 334 and $R_{TN}$ 344 may similarly be realized through integrating the integrating the capacitive sensor elements 230 and 240 of FIG. 2 with integrated members 232 and 242, respectively.

For some embodiments, $R_{T1}$ 324 of FIGS. 3 and 4 may be further reduced by lowering the resistance $R_I$ 425 of FIG. 4 through selection of a relatively low resistance material (e.g., copper) for the interconnect 205 of FIG. 2. Similarly, $R_{T2}$ 334 and $R_{TN}$ 344 can be minimized through selection of low resistance material for interconnects 250 and 260.

Reducing resistance in the RC network circuit 300 as described herein may alternatively or additionally provide for reduced power consumption during scanning. For example, less power may be consumed by heat dissipation through the RC network circuit 300 when the lower resistances are present. For some embodiments, the lower resistances may allow the sensing module 106 to consume less power in applying a current, which is sufficient for scanning, through the RC network circuit 300.

Referring again to the representative capacitive sensor element 210 and integrated member 218 FIG. 2, the size (e.g., the width and length) of the integrated members 218 coupled to the capacitive sensor element 210 may affect a degree to which the integrated resistance $R_{IG}$ 429 of FIG. 4 may be reduced below the sensor element resistance $R_S$ 426 of FIG. 4. Example widths and lengths of integrated members are discussed with respect to FIGS. 5 and 6.

Figure 5:
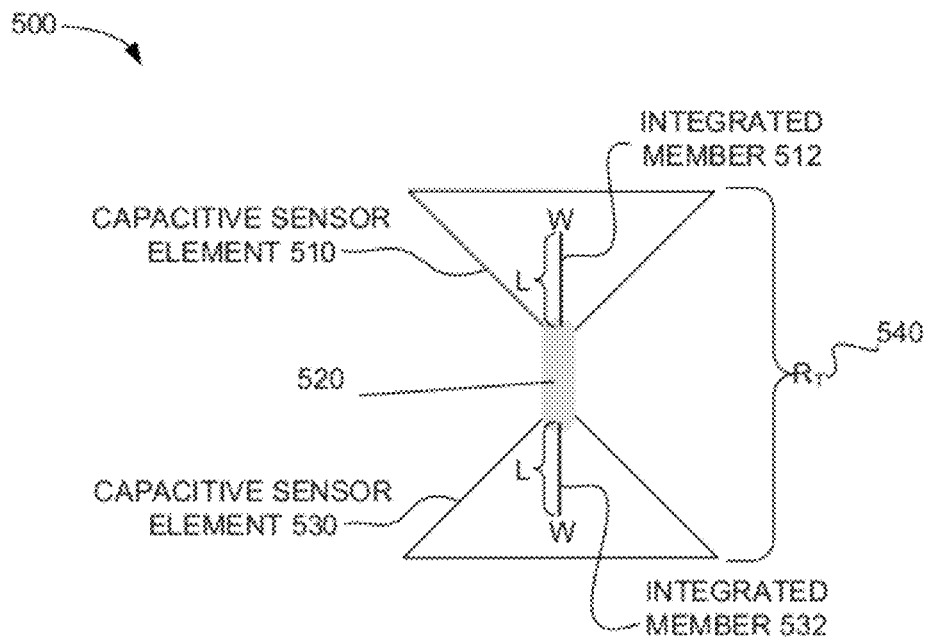
FIG. 5 is a block diagram depicting a capacitive sensor model used to simulate resistance, in accordance with an embodiment.

FIG. 5 is a block diagram depicting a capacitive sensor model 500 used to simulate resistance, in accordance with an embodiment. The capacitive sensor model 500 is shown to include a capacitive sensor element 510 integrated with an integrated member 512 and a capacitive sensor element 530 integrated with an integrated member 532. The capacitive sensor elements 510 and 530 are shown to be connected in series through an interconnect 520. In the capacitive sensor model, the interconnect 520 is made from metal.

Each integrated member 512 and 532 is defined by a width (W) and a length (L). In the capacitive sensor model, the length L represents the length of the integrated member 512 or 532 from an end of the interconnect 520 into the respective capacitive sensor element 510 or 530. The integrated members 512 and 532 of the capacitive sensor model 500 are thin copper strips having a have a nominal width of 6 micrometers.

To simulate scanning, 1 volt may be applied to the capacitive sensor element 510 while the other capacitive sensor element 530 is held at 0 volts. A simulated current due to the voltage difference may flow through the capacitive sensor model 500. A resistance $R_T$ 540 represents the resistance to the current that flows through the capacitive sensor model 500. The resistance $R_T$ 540 may be applied as a resistance in an appropriate form of the Elmore delay equation to approximate delay. The results of simulation, which are described with respect to FIG. 5, illustrate that the resistance $R_T$ 540 may decrease as the length L of the integrated members is increased. The resistance $R_T$ 540 of the capacitive sensor model 500 is expressed in FIG. 6 as a number of squares (e.g., a number of 2-dimensional square sheets having a resistance value of 1 Ohm) but can be expressed as resistance in Ohms by multiplying a manufacturers specified sheet resistance (e.g., Ohms per square) of the ITO. The interconnect 520 can be considered to have negligible resistance in the simulation.

Figure 6:
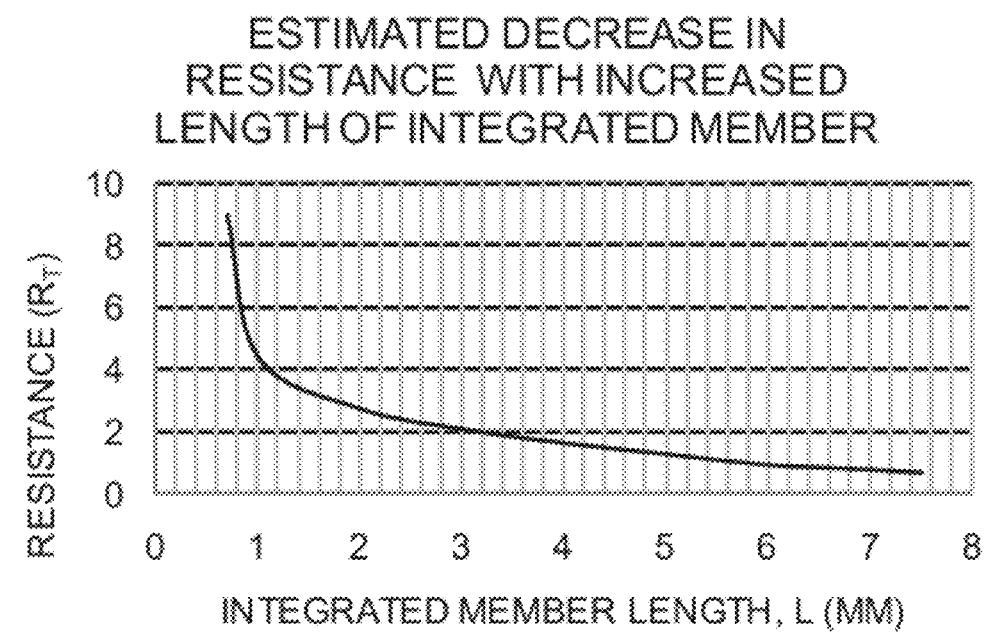
FIG. 6 is a graph showing an estimated decrease in resistance with a decrease in length of an integrated member, in accordance with an embodiment.

FIG. 6 is a graph 600 showing an estimated decrease in resistance with a decrease in length of an integrated member, in accordance with an embodiment. Referring to FIGS. 5 and 6, the length L of the integrated members 512 and 532 of FIG. 5 is reflected on the x-axis of the graph 600 of FIG. 6. The resistance $R_T$ 540 is reflected as a number of squats on the y-axis of the graph 600 of FIG. 6.

The simulation illustrates that $R_T$ 540 decreases as the length L of the integrated members 512 and 532 increases. For example, when the length L of the integrated members 512 and 532 is approximately 0.8 millimeters, the resistance $R_T$ 540 through the capacitive sensor model 500 is approximately 6 squares. On the other hand, when the length of the integrated members 512 and 532 is approximately 3 millimeters, the resistance $R_T$ 540 is shown to drop to nearly 2 squares. Based on the Elmore delay equation, this reduced resistance $R_T$ 540 will result in reduced scanning delay (e.g., due to increasing the length, L of integrated members). As discussed above, power consumption in scan operations is also reduced through lowering the resistance $R_T$ 540.

Not only can increasing the length of an integrated member reduce the resistance $R_T$ 540 in the capacitive sensor model, as discussed with respect to FIG. 7, certain shapes or patterns of the integrated member can also reduce the resistance $R_T$ 540.

FIG. 7 is a chart 700 showing various integrated member geometries and corresponding estimated resistance values, in accordance with various embodiments. The estimations are based on simulations for various capacitive sensor model embodiments (e.g., similar to the capacitive sensor model 500 of FIG. 5) including capacitive sensor elements integrated with integrated members. The example capacitive sensor models differ by the shape or pattern of integrated member and one example model does not include an integrated member.

Returning to FIG. 7, arrangement 702, does not include any integrated members and out of the various geometries illustrated has the highest resistance value of 3.91 squares. On the other hand, arrangements 704 and 706, which do include integrated members (e.g., having different shapes) are shown to yield lower resistances of 0.47 squares and 0.53 squares, respectively. The arrangement 708, which also includes integrated members is shown to yield the lowest resistance of 0.41 squares, by way of comparison. The simulation results of FIG. 7 illustrate various shapes or patterns of integrated members may be utilized to optimize resistance in a capacitive sensor arrangement. It will be noted that shapes and patterns of integrated members not shown in FIG. 7 may be employed to optimize the resistance without departing from the scope of the claimed subject matter.

The reduction in scanning delay and/or reduction in power consumption discussed above may also be significant in embodiments where the number of capacitive sensor elements employed in an application is increased. FIGS. 8-12 relate to embodiments of capacitive sensing systems that use numerous capacitive sensor elements (e.g., a capacitive sensor matrix), each capacitive sensor element integrated with one or more integrated members.

Figure 8:
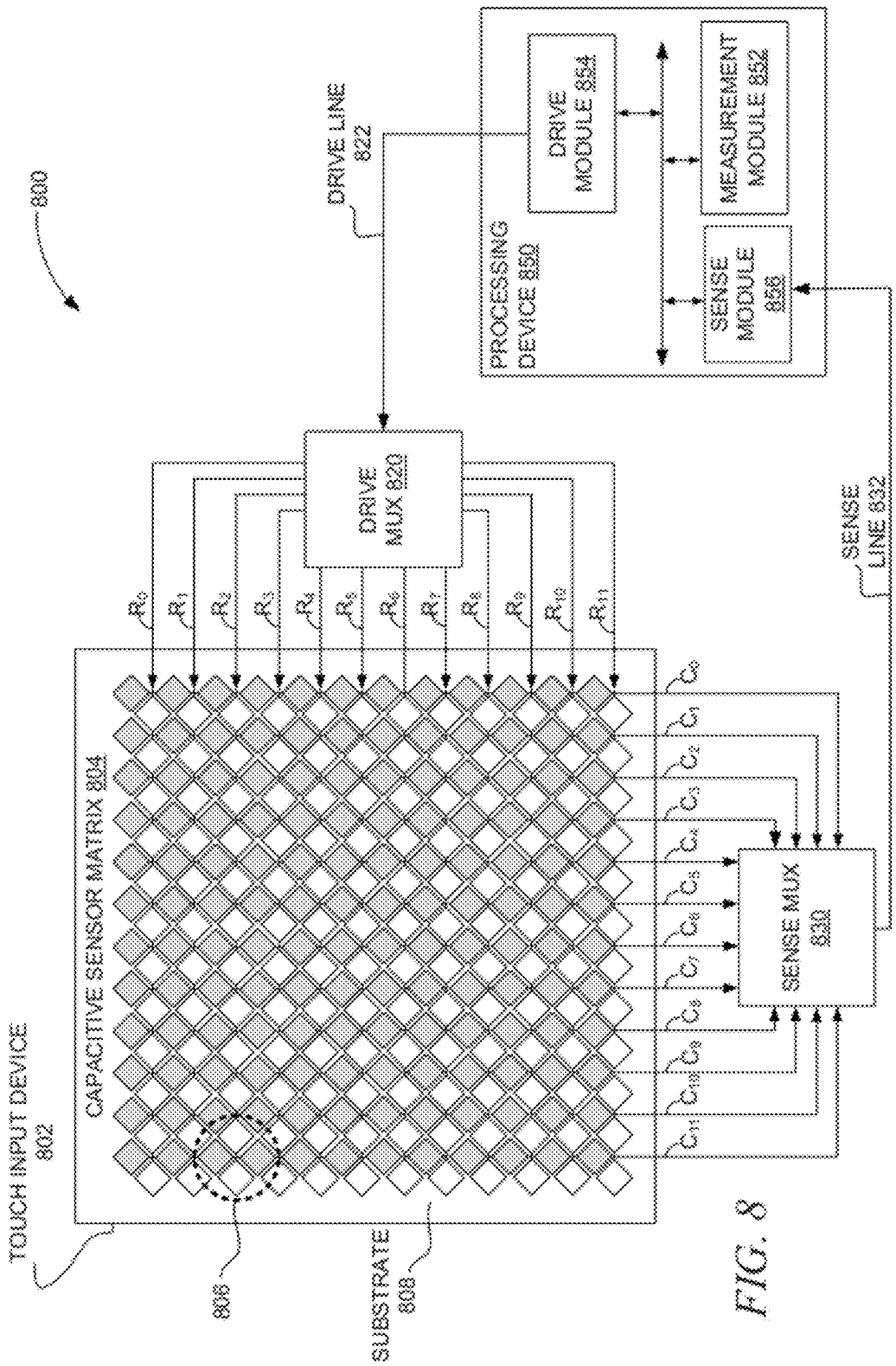
FIG. 8 is a block diagram illustrating an example capacitive sensing system, in accordance with various embodiments.

FIG. 8 is a block diagram illustrating an example capacitive sensing system 800, in accordance with various embodiments. The capacitive sensing system 800 is shown to include a touch input device 802 coupled with a processing device 850. The touch input device 802 may be, for example, a touch-sensor pad, a touch-screen display, a touch-sensor slider, a touch-sensor button, or other device.

The touch input device 802 is shown to include a capacitive sensor matrix 804 residing upon a substrate 808. The example substrate 808 may have a relatively low conductivity compared to electronic components that reside on the substrate 808. In an embodiment, the capacitive sensor elements of the capacitive sensor matrix 804 are formed from ITO. An ITO layer including the capacitive sensor elements may be positioned over a display area (e.g., in a touch-screen display) and protected with a protective layer.

The capacitive sensor matrix 804 is shown to include capacitive sensor elements arranged in rows and columns (e.g., defining a two-dimensional grid) that can be used to detect the proximity, touch, position, and/or movement of a conductive object (e.g., a user's finger).

The rows of capacitive sensor elements in the capacitive sensor matrix 804 are shown to be coupled to row traces $R_0$-$R_{11}$, which are shown to be coupled with the processing device 850 through a drive multiplexer (MUX) 820 and a drive line 822. The columns of capacitive sensor elements in capacitive sensor matrix 804 are shown to be coupled to column traces $C_0$-$C_{11}$, which are shown to be coupled with the processing device 850 through the sense MUX 830 and a sense line 832. In an embodiment, the capacitive sensor elements may be integrated with the integrated members (not shown n FIG. 8). The encircled capacitive sensor elements 806 are discussed in particular with respect to FIGS. 9-12, where embodiments of the integrated members are shown and described.

The processing device 850 is shown to include drive module 854, a sense module 856, and a measurement module 852. Various embodiments of the processing device 850 are described below with respect to FIG. 16.

The drive module 854, the sense module 856, and the measurement module 852 may provide the functionality of the sensing module of FIGS. 1 and 2. In various embodiments, the drive module 854, sense module 856, and/or the measurement module 852 are implemented with hardware, software, or a combination of the two.

The measurement module 852 is to measure changes in capacitance associated with the capacitive sensor elements of the capacitive sensor matrix 804. It will be noted that the measurement module 852 may use any of various known methods for measuring capacitance. By way of example and not limitation, the measurement module 852 may use relaxation oscillator methods, provide current versus voltage phase shift measurements, measure resistor-capacitor charge timing, and/or utilize a capacitance bridge divider, charge transfer, successive approximation, sigma-delta modulation, charge-accumulation circuits, field effect, mutual capacitance, and/or frequency shift techniques. For some embodiments, the measurement module 852 may direct the operation of the drive module 854 and the sense module 856 through control signals.

The drive module 854 is to provide a portion of a scan operation that includes energizing capacitive sensor elements of the capacitive sensor matrix 804. For some embodiments, the drive module 854 may energize the capacitive sensor elements through a scanning current.

The sense module 856 is to provide a portion of the scan operation that includes obtaining a signal from energized capacitive sensor elements that may be used to represent an actual capacitance of the energized capacitive sensor elements. In an embodiment, the measurement module 852 may compare the actual capacitance of the energized capacitive elements with an expected capacitance to determine whether a conductive object is proximate to or in contact with capacitive sensor elements of the capacitive sensor matrix 804.

In an embodiment, the capacitive sensing system 800 operates using a mutual capacitance sensing technique, where a mutual capacitance may be formed at the intersection of two capacitive sensor elements in the capacitive sensor matrix 804. A conductive object proximate to the intersection may cause a change in this mutual capacitance. The change in capacitive may be measured by the measurement module 852. The measurement module 852 or another module and/or circuit may use the measured change in capacitance to determine a location or position of the conductive object relative to the capacitive sensor matrix 804.

In an embodiment of mutual capacitance sensing, the capacitive sensor elements oriented along a row may be driven by the drive module 854 with a current through the drive line 822, the drive MUX 820, and a selected row trace of the drive traces $R_0$-$R_{11}$. The capacitive sensor elements oriented along a column may be sensed by the sense module 856 through the sense line 832, the sense MUX 830, and a selected column trace of the column traces $C_0$-$C_{11}$. In an embodiment, the processing device 850 controls the drive MUX 820 to distribute energizing current from the drive module 854 to an appropriate row of capacitive sensor elements. Likewise, the processing device 850 may control the sense MUX 830 to retrieve the sensing current from the appropriate column of the capacitive sensing matrix 804. The designation of rows and columns to include the driven and sensed capacitive sensor elements is merely one example, and in other embodiments, the designation may be reversed.

Figure 9:
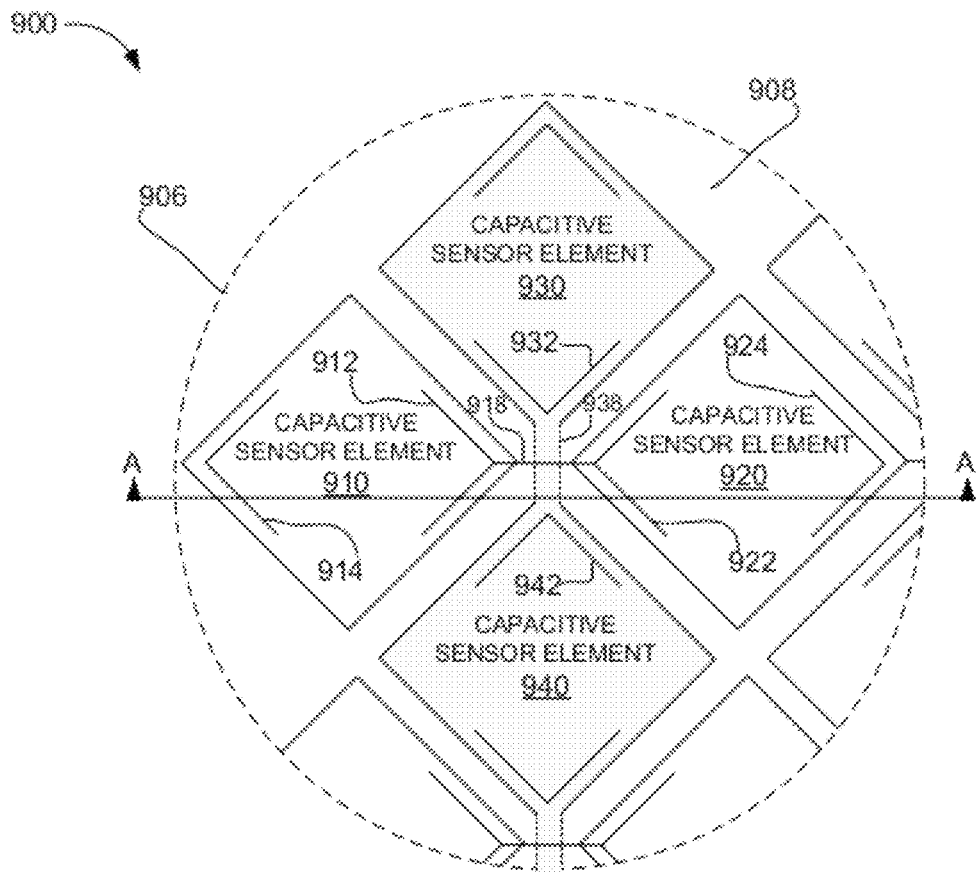
FIG. 9 is a block diagram illustrating a top view of capacitive sensor elements in a single layer capacitive sensor matrix, in accordance with various embodiments.
Figure 10:
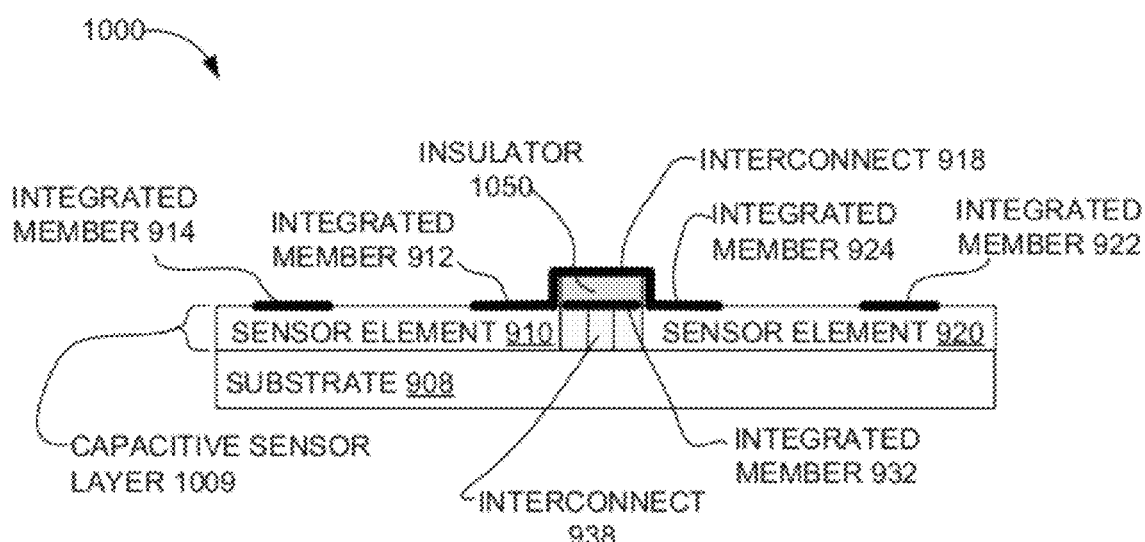
FIG. 10 is a block diagram illustrating a front view of capacitive sensor elements in the single layer capacitive sensor matrix, in accordance with various embodiments.

In the embodiments described with respect to FIGS. 9 and 10, the encircled capacitive sensor elements 806 of the capacitive sensor matrix 804 are formed on a single layer upon the substrate 808. In the embodiments described with respect to FIGS. 11 and 12, the encircled capacitive sensor elements 806 of the capacitive sensor matrix 804 are formed on more than one layer upon the substrate 808.

FIG. 9 is a block diagram illustrating a top view 900 of capacitive sensor elements 806 in a single layer capacitive sensor matrix, in accordance with various embodiments. FIG. 10 is a block diagram illustrating a front view 1000 of capacitive sensor elements 806 of the single layer capacitive sensor matrix, in accordance with various embodiments. FIG. 10 shows the front view along the section A-A of FIG. 9.

The encircled capacitive sensor elements 906 are shown to include capacitive sensor elements 910, 920, 930, and 940, which are shown to include integrated members 912, 914, 922, 924, 932, and 942.

The capacitive sensor elements 910, 920, 930, and 940 are shown to reside in a capacitive sensor layer 1009 on a substrate 908. The capacitive sensor layer 1009 may be considered the single layer of the capacitive sensor matrix because the capacitive sensor elements used to determine the presence of a conductive object may all reside in that layer 1009.

The capacitive sensor elements 930 and 940 are shown to be connected through the interconnect 938, which is also shown to reside in the capacitive sensor layer 1009. The capacitive sensor elements 910 and 920 are shown to be connected through the interconnect 918. The integrated member 912 of the capacitive sensor element 910 and the integrated member 922 of the capacitive sensor element 920 are shown to be coupled to opposite ends of the interconnect 918. The interconnect 918 is shown to reside, at least in part, in a different layer or plane than the interconnect 938 and the capacitive sensor elements 910, 920 and 930 do.

For some embodiments, the interconnect 918 may include a copper strip that is no wider than 8 micrometers. An insulator 1050 may be reside between the interconnect 918 and the interconnect 938 so as to avoid an electrical contact between the capacitive sensor elements 910, 920 and the capacitive sensor elements 930 and 940. In this way, the interconnect 918 may be considered a jumper because it jumps over the interconnect 938 to connect the capacitive sensor element 910 with the capacitive sensor element 920. Insulating the capacitive sensor elements 910 and 920 from the capacitive sensor elements 930 and 940 may supports the controlled formation and discharge of mutual capacitance between capacitive sensor elements. For example, the drive module 854 of FIG. 8 may drive the capacitive sensor elements 910 and 920 of FIG. 9 to form a capacitance between the capacitive sensor element 910 and the capacitive sensor element 930. The sense module 856 of FIG. 8 may sense through the capacitive sensor elements 930 and 940 to sense the capacitance formed between the capacitive sensor element 910 and the capacitive sensor element 930.

The integrated members 912, 914, 922, 924, 932, and 942 may be so thin that they are visually imperceptible to the naked eye user of a touchscreen employing the capacitive sensor matrix of FIG. 8. For example, a typical user would not be able to distinguish the integrated members 912, 914, 922, 924, 932, and 942 from the capacitive sensor elements 910, 920, 930, and 940 when a user is viewing an image (e.g., projected by a liquid crystal display (LCD)) through the capacitive sensor layer 1009 (e.g., an ITO layer) upon which the integrated members 912, 914, 922, 924, 932, and 942 may be overlaid. In various embodiments, the integrated members 912, 914, 922, 924, 932, and 942 may be less than 8 micrometers wide.

The integrated members 912, 914, 922, 924, 932, and 942 may have a lower electrical resistance than an electrical resistance of the capacitive sensor elements 910, 920, 930, and 940. For example, integrated members 912, 914, 922, 924, 932, and 942 may be made from copper strips have a lower resistance than capacitive sensor elements 910, 920, 930, and 940 made from ITO.

As introduced above, the encircled capacitive sensor elements 806 of the capacitive sensor matrix 804 shown in FIG. 8 may be also formed on more than one layer of the substrate 808 of FIG. 8.

Figure 11:
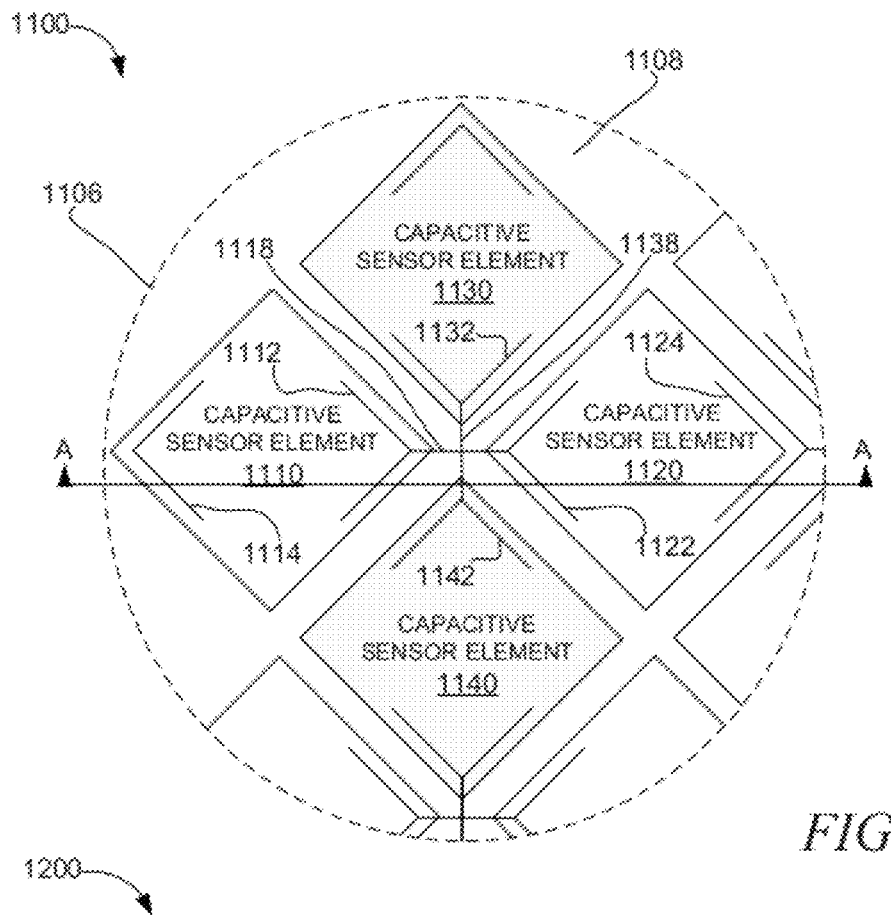
FIG. 11 is a block diagram illustrating a top view of capacitive sensor elements in a double layer capacitive sensor matrix, in accordance with various embodiments.
Figure 12:
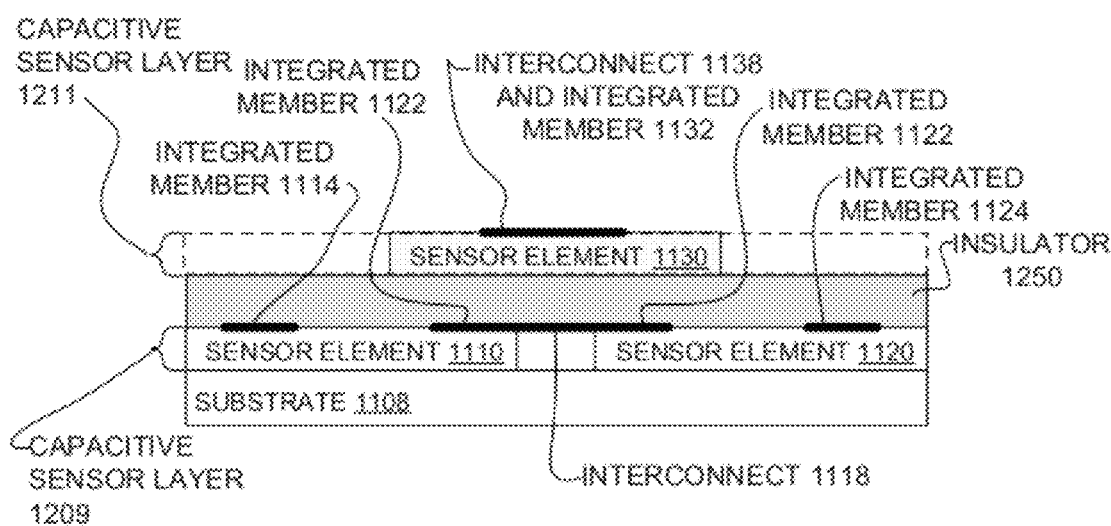
FIG. 12 is a block diagram illustrating a front view of capacitive sensor elements in the double layer capacitive sensor matrix, in accordance with various embodiments.

FIG. 11 is a block diagram illustrating a top view 1100 of capacitive sensor elements 806 of FIG. 8 in a double layer capacitive sensor matrix, in accordance with various embodiments. FIG. 12 is a block diagram illustrating a front view 1200 of capacitive sensor elements 806 in the double layer capacitive sensor matrix, in accordance with various embodiments. FIG. 12 shows the front view along the section A-A of FIG. 11.

The encircled capacitive sensor elements 1106 are shown to include capacitive sensor elements 1110 and 1120 in a capacitive sensor layer 1209 upon a substrate 1108 and the capacitive sensor elements 1130 and 1140 in another capacitive sensor layer 1211 upon the substrate 1108. The capacitive sensor layer 1209 and the capacitive sensor layer 1211 are shown to be separated by an insulator 1250.

In the capacitive sensor layer 1209, the capacitive sensor elements 1110 and 1120 are shown to include the integrated members 1112, 1114, 1122, and 1124. The integrated members 1112 and 1122 are shown to be coupled to the interconnect 1118. In the capacitive sensor layer 1211, the capacitive sensor elements 1130 and 1140 are shown to include the integrated members 1132 and 1142. The integrated members 1132 and 1142 are shown to be coupled to the interconnect 1138.

A parasitic capacitance may form between the interconnects 1118 and 1138. The parasitic capacitance may contribute to the mutual capacitance discussed above with respect to FIGS. 2 and 3. The value of the parasitic capacitance formed may depend on the surface areas of each interconnect 1118 and 1138 that holds and exchanges charge with the other interconnect. In an embodiment, the value of the parasitic capacitance may be reduced by using interconnects of reduced width. For example, the interconnects 1118 and 1138 made from copper strips 6 micrometers wide may form a lower parasitic capacitance than that formed by wider interconnects made from ITO.

Reducing the parasitic capacitance of interconnects, and consequently the capacitances in the Elmore delay equation, may result in faster scanning speed (e.g., reduced propagation delay). As already discussed, the use of the example integrated members as described herein may reduce the resistance to scanning current, which consequently may reduce scanning delay and power consumption of scan operations.

Figure 13:
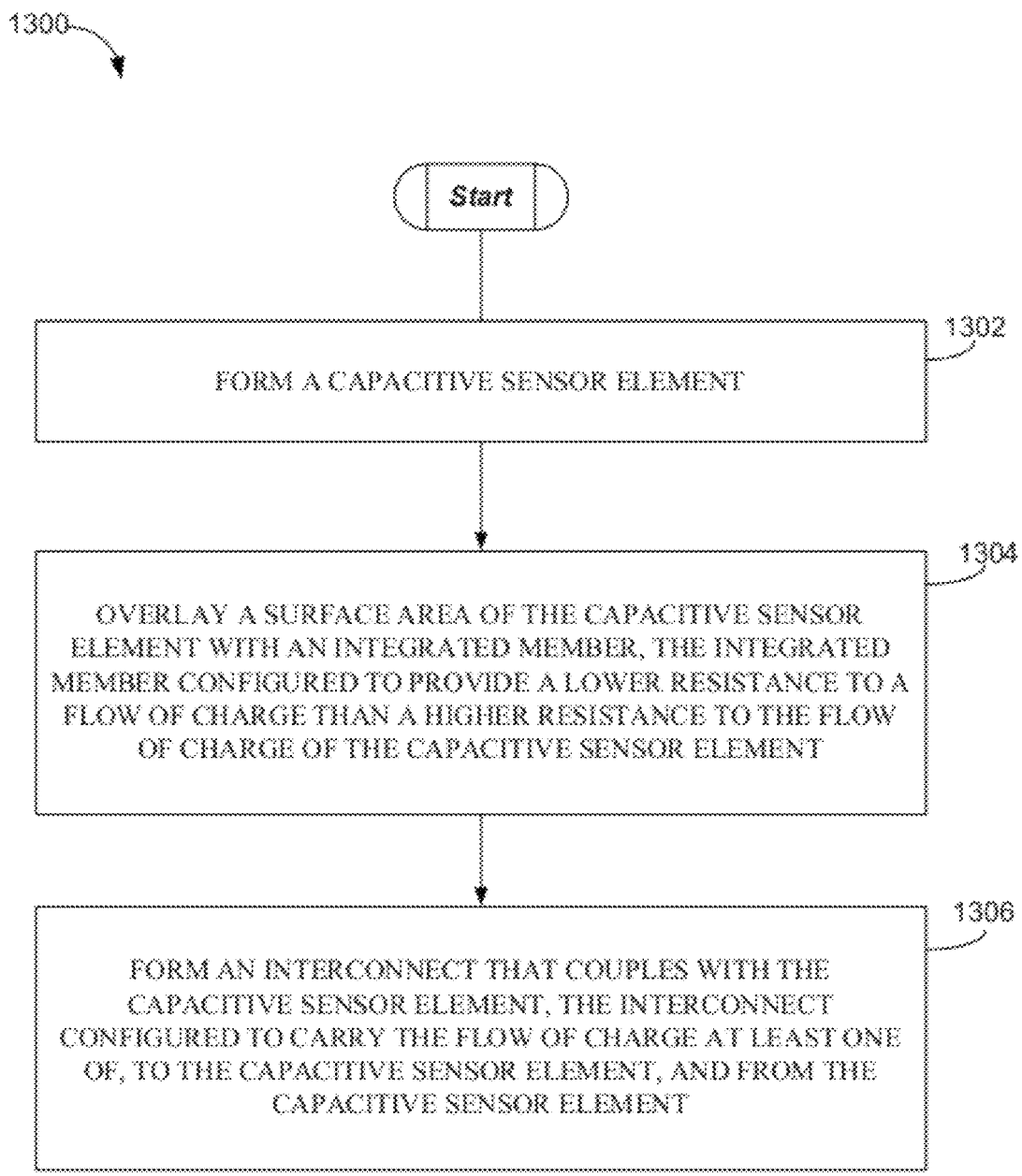
FIG. 13 is a flow diagram illustrating an example method for arranging a capacitive sensor element, in accordance with various embodiments.

FIG. 13 is a flow diagram illustrating an example method 1300 for arranging a capacitive sensor element, in accordance with various embodiments. The method 1300 may be performed as part of a fabrication process and may include one or more of various processing steps known in the art including but not limited to patterning, deposition, removal processes, and doping. The method 1300 refers to components of FIG. 2 for the purpose of explanation and not to limit the claimed subject matter.

At block 1302, the method 1300 may include forming a capacitive sensor element 210. Block 1304 is shown to include overlaying a surface area of the capacitive sensor element 210 with an integrated member 218 that is configured to provide a lower resistance to a flow of charge (e.g., a current) than a higher resistance to the flow of charge of the capacitive sensor element 210. Block 1306 is shown to include forming an interconnect 205 that couples with the capacitive sensor element 210, the interconnect 205 configured to carry the flow of charge at least one of, to the capacitive sensor element 210, and from the capacitive sensor element 210.

Referring to the method 1300, the forming of the capacitive sensor element 210 may include etching the capacitive sensor element 210 from a transparent conductive film, and the overlaying of the surface area with the integrated member 218 may include overlaying the surface area with a metal strip that is visually indistinguishable from the transparent conductive film to a naked eye of a user. For example, the overlaid metal strip may be approximately 6 to 8 micrometers wide. For some embodiments, overlaying of the surface area with the integrated member 218 may include placing the integrated member 218 in electrical contact with the border region 212 of the capacitive sensor element 210 and the interior region 216 of the capacitive sensor element 210. In an embodiment, the integrated member 218 may be directly coupled with the interconnect 205 in the border region 212.

Figure 14:
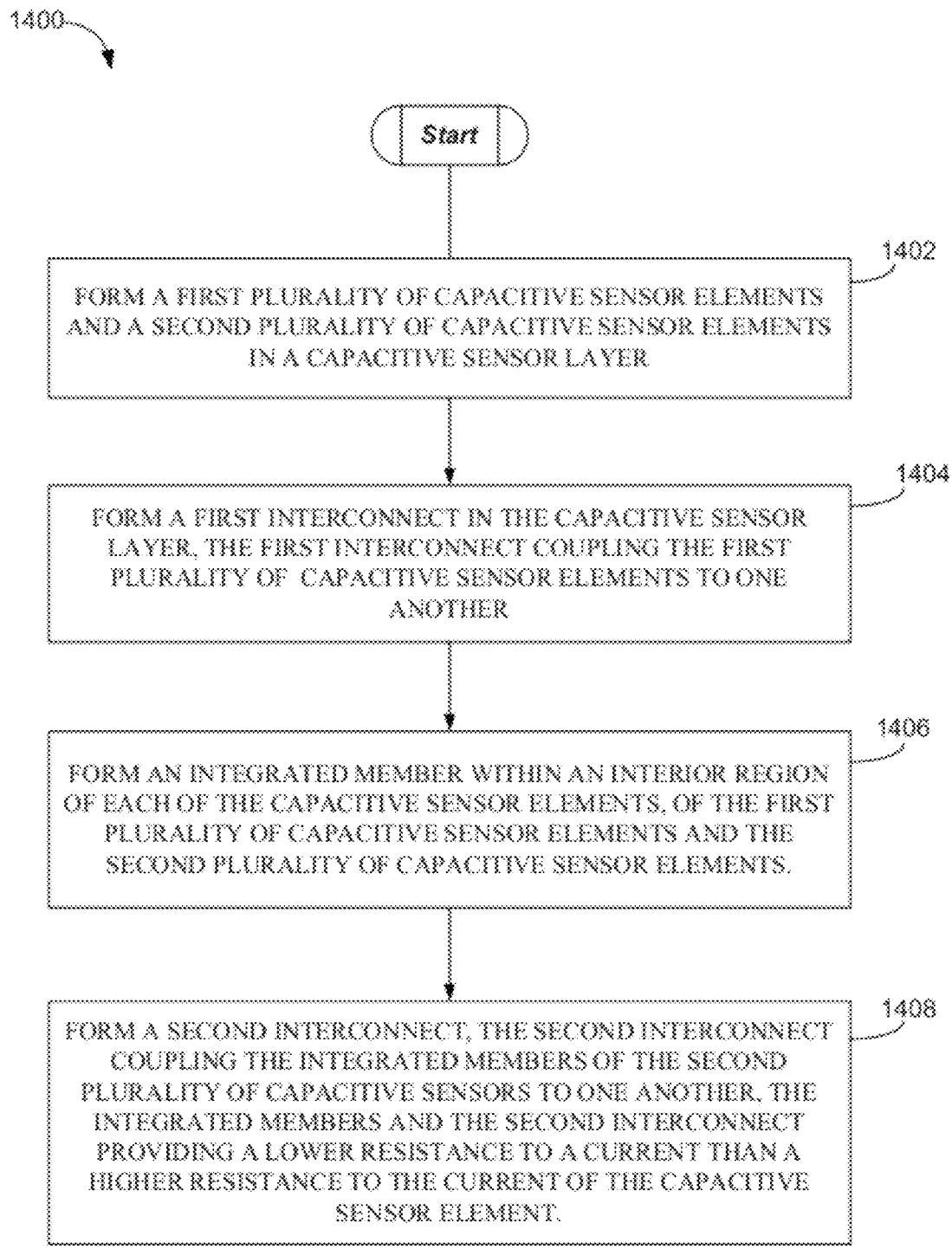
FIG. 14 is a flow diagram illustrating an example method for integrating a capacitive sensor element with an integrated member in a single layer capacitive sensor matrix, in accordance with various embodiments.

FIG. 14 is a flow diagram illustrating an example method 1400 for integrating a capacitive sensor element with an integrated member in a single layer capacitive sensor matrix, in accordance with various embodiments. The method 1400 may be performed as part of a fabrication process and may include processing one or more of various processing steps known in the art including but not limited to patterning, deposition, removal processes and doping. Components of FIGS. 9 and 10 are referred to explain the method 1400 but not to limit the claimed subject matter.

At block 1402, the example method 1400 may include forming capacitive sensor elements 910 and 920, and the capacitive sensor elements 930 and 940 in a capacitive sensor layer 1009. Block 1404 is shown to include forming an interconnect 938 in the capacitive sensor layer 1009, the interconnect 938 coupling the capacitive sensor elements 930 and 940 to one another. At block 1406, the method 1400 includes forming an integrated member 912, 922, 932, and 942 within an interior region of each of the capacitive sensor elements 910, 920, 930, and 940. At block 1408, the method 1400 may include forming another interconnect 918, the other interconnect 918 coupling the integrated members 912 and 922 of the capacitive sensor elements 910 and 920 to one another, the integrated members 912 and 922 and the other interconnect 918 providing a lower resistance to a current than a higher resistance to the current of the capacitive sensor elements 910 and 920. In embodiments, the other interconnect 918 (e.g., introduced in block 1408) is formed to as to avoid electrical contact with the interconnect 938 and the capacitive sensor elements 930 and 940.

Figure 15:
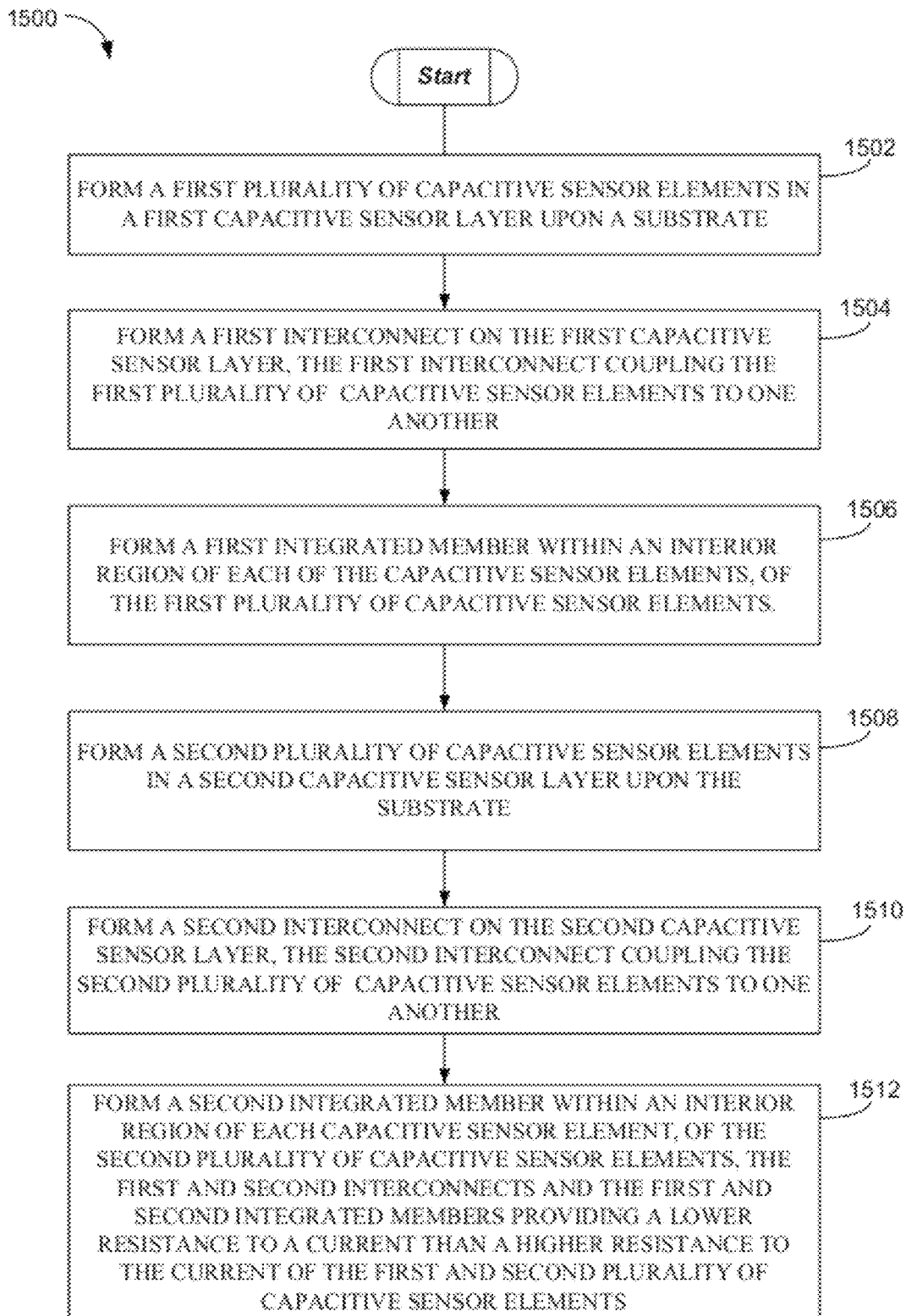
FIG. 15 is a flow diagram illustrating an example method for integrating a capacitive sensor element with an integrated member in a double layer capacitive sensor matrix, in accordance with various embodiments.

FIG. 15 is a flow diagram illustrating an example method 1500 for integrating a capacitive sensor element with an integrated member in a double layer capacitive sensor matrix, in accordance with various embodiments. The method 1500 may be performed as part of a fabrication process and may include processing one or more of various processing steps known in the art including but not limited to patterning, deposition, removal processes and doping. Components of FIGS. 11 and 12 are referred to explain the method 1500 but not to limit the claimed subject matter.

At block 1502, the example method 1500 may include forming capacitive sensor elements 1110 and 1120 in a capacitive sensor layer 1209 upon a substrate 1108. At block 1504, the method 1500 may include forming an interconnect 1118 on the capacitive sensor layer 1209, the interconnect 1118 coupling the capacitive sensor elements 1110 and 1120 to one another. Block 1506 is shown to include forming an integrated member 1112 within an interior region of the capacitive sensor elements 1110, and forming an integrated member 1122 within an interior region of the capacitive sensor element 1120. Block 1508 is shown to include forming capacitive sensor elements 1130 and 1140 in another capacitive sensor layer 1211 upon the substrate 1108. At block 1510, the method 1500 may include forming an interconnect 1138 on the capacitive sensor layer 1211, the interconnect 1138 coupling the capacitive sensor elements 1130 and 1140 to one another. At block 1512, the method 1500 may include forming an integrated member 1132 within an interior region of the capacitive sensor element 1130 and forming an integrated member 1142 within an interior region of the capacitive sensor element 1140, the integrated members 1112, 1122, 1132, and 1142 and the interconnects 1118 and 1138 providing a lower resistance to a current than a higher resistance to the current of the capacitive sensor elements 1110, 1120, 1130, and 1140.

Figure 16:
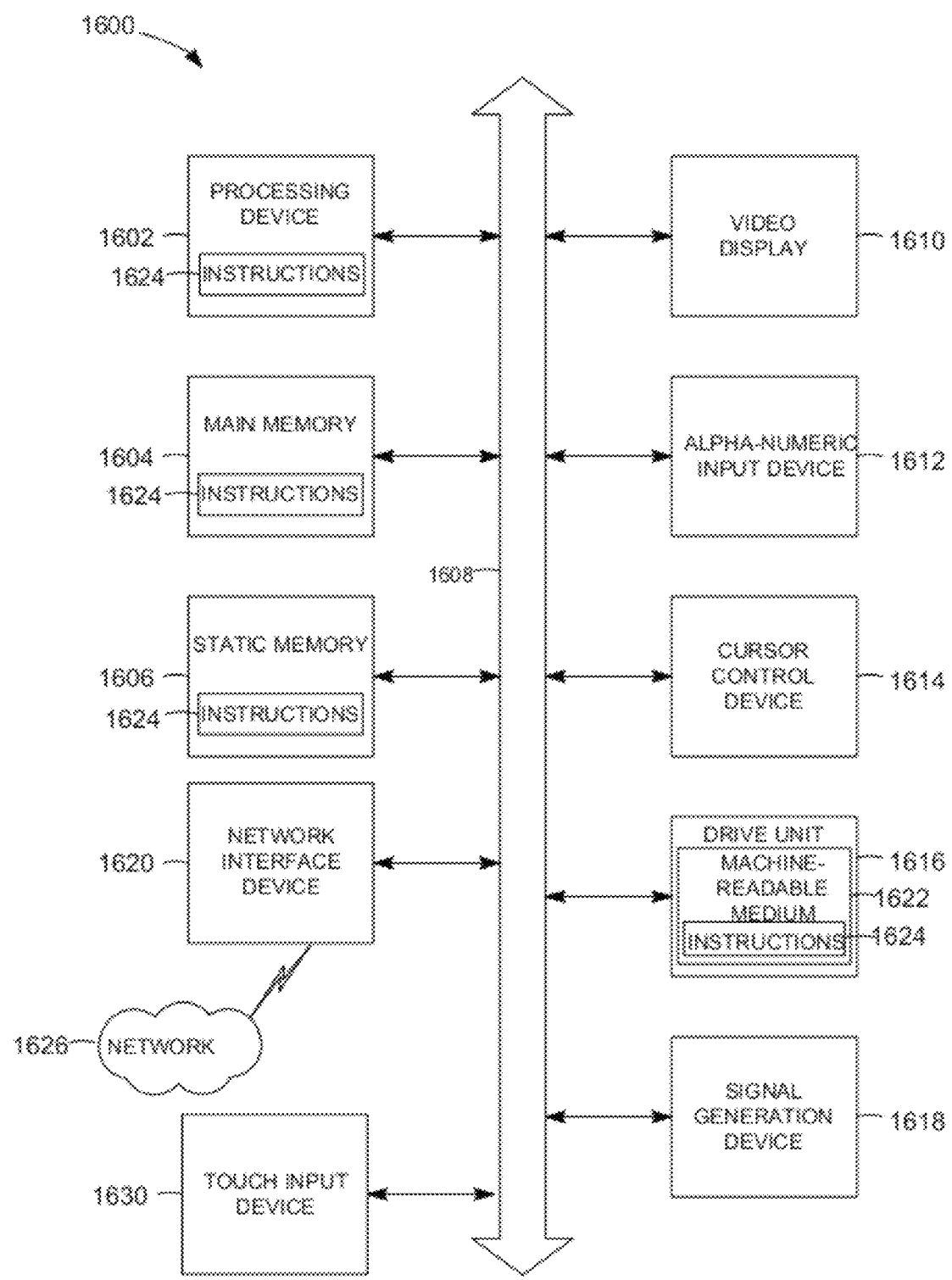
FIG. 16 is a block diagram illustrating an example machine, in accordance with various embodiments.

FIG. 16 is a block diagram illustrating an example machine 1600, in accordance with various embodiments. In various embodiments, the machine 1600 may operate as a standalone device or may be connected (e.g., networked) to other machines. In a networked deployment, the machine 1600 may operate in the capacity of a server or a client machine in a server-client network environment, or as a peer machine in a peer-to-peer (or distributed) network environment. The machine 1600 may be a server computer, a client computer, a personal computer (PC), a tablet PC, a set-top box, a personal digital assistant, a cellular telephone, a web appliance, a network router, switch or bridge, or any machine capable of executing a set of instructions (sequential or otherwise) that specify actions to be taken by that machine.

The term "machine" shall also be taken to include any collection of machines that individually or jointly execute a set (or multiple sets) of instructions to perform any one or more of the methodologies discussed herein.

The example machine 1600 is shown to include a touch input device 1630 coupled to a processing device 1602 via bus 1608. The touch input device 1630 may include one or more capacitive sensor elements arranged as the capacitive sensor matrix 804 described above with respect to FIG. 8. In an embodiment, touch input device 1630 may exchange signals with the processing device 1602, via the bus 1608, to allow capacitance to be measured by the processing device 1602. In various embodiments, the touch input device 1630 may include a touch-sensor slider, on or more touch-sensor buttons, and/or a touchscreen.

The example machine 1600 is shown to include the processing device 1602, a main memory 1604, and a static memory 1606, which may communicate with each other via the bus 1608. In an embodiment, the processing device 1602 may be representative of the processing device 850 discussed above with respect to FIG. 8. For some embodiments, the processing device 1602 may include or implement the sensing module 106 described above with respect to FIG. 1.

In some embodiments, the processing device 1602 may include a system on a chip such as a Programmable System on a Chip (PSoC®) processing device, developed by Cypress Semiconductor Corporation, San Jose, Calif. In various embodiments, a programmable system on a chip may include digital and analog I/O that are each configurable to interface with a selected external component. For example, a user may configure and/or reconfigure configurable analog I/O of the programmable system on a chip to exchange analog signals with the touch input device via the bus 1608.

Alternatively or additionally, the processing device 1602 may be one or more other processing devices known by those of ordinary skill in the art, such as a microprocessor or central processing unit, a graphics processing unit, a controller, special-purpose processor, digital signal processor (DSP), an application specific integrated circuit (ASIC), a field programmable gate array (FPGA), or the like. In an embodiment, the processing device 1602 may be a network processor having multiple processors including a core unit and multiple microengines. Alternatively or additionally, the processing device 1602 may include any combination of general-purpose processing device(s) and special-purpose processing device (s).

The Processing device 1602 may communicate with a host processor, via host interface (I/F) (not shown). It will be noted that in the embodiments described herein the processing device 1602 may measure the capacitance on the touch input device 1630 and send the related raw data to a local or remote host computer where it is analyzed by an application to determine position of conductive object. As such, the related raw data that could be processed by processing device 1602 may be processed through the local or remote host. In another embodiment, the processing device 1602 includes the host.

The machine 1600 may further include a video display unit 1610 (e.g., an LCD or a cathode ray tube). The machine 1600 is also shown to include an alphanumeric input device 1612 (e.g., a keyboard), a cursor control device 1614 (e.g., a mouse), a drive unit 1616, a signal generation device 1618 (e.g., a speaker) and a network interface device 1620.

The drive unit 1616 is shown to include a machine-readable medium 1622 on which is stored one or more sets of instructions 1624 (e.g., software) embodying any one or more of the methodologies or functions described herein. The instructions 1624 may also reside, completely or at least partially, within the main memory 1604 and/or within the processing device 1602 during execution thereof by the machine 1600, the main memory 1604, and the processing device 1602 may also constitute machine-readable media. The instructions 1624 may further be transmitted or received over a network 1626 via the network interface device 1620.

While the machine-readable medium 1622 is shown in an embodiment to be a single medium, the term "machine-readable medium" should be taken to include a single medium or multiple media (e.g., a centralized or distributed database, and/or associated caches and servers) that store the one or more sets of instructions 1624. The term "machine-readable medium" shall also be taken to include any medium that is capable of storing, encoding or carrying a set of instructions for execution by the machine 1600 and that may cause the machine 1600 to perform any one or more of the methodologies disclosed herein. The term "machine-readable medium" shall accordingly be taken to include, but not be limited to, solid-state memories, and optical and magnetic media.

Example capacitive sensor arrangements have been described. Although the claimed subject matter has been described with reference to specific embodiments, it will be evident that various modifications and changes may be made to these embodiments without departing from the broader spirit and scope of what is claimed. Accordingly, the specification and drawings are to be regarded in an illustrative rather than a restrictive sense.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. In the event of inconsistent usages between this document and those documents so incorporated by reference, the usage in the incorporated reference(s) should be considered supplementary to that of this document; for irreconcilable inconsistencies, the usage in this document controls.

The above description is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended; a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

What is claimed is:

1. A capacitive sensor arrangement, comprising:
a capacitive sensor element having a first resistance to a flow of current;
an integrated member residing within a first interior region of the capacitive sensor element, the integrated member having a second resistance to the flow of current, the second resistance to the flow of current being less than the first resistance to the flow of current; and
an interconnect coupled to a second interior region of the capacitive sensor element that is different from the first interior region, the interconnect configured to carry the flow of current at least one of to the capacitive sensor element and from the capacitive sensor element.

2. The capacitive sensor arrangement of claim 1, wherein the interior region of the capacitive sensor element includes a surface area of the capacitive sensor element, and the integrated member is coupled with the surface area.

3. The capacitive sensor arrangement of claim 1, wherein the capacitive sensor element includes a border region that is a border between at least a portion of the interior region and an edge of the capacitive sensor element, and the integrated member extends between the interior region and the border region.

4. The capacitive sensor arrangement of claim 1, wherein the capacitive sensor element is comprised of a transparent conducting film and the integrated member is visually indistinguishable from the capacitive sensor element to a naked eye of a user.

5. The capacitive sensor arrangement of claim 4, wherein the integrated member has a width ranging from around 6 micrometers to around 8 micrometers.

6. The capacitive sensor arrangement of claim 4, wherein the integrated member is comprised of metal.

7. The capacitive sensor arrangement of claim 1, wherein the interconnect has the second resistance to the flow of current.

8. The capacitive sensor arrangement of claim 7, wherein the interconnect is coupled with the integrated member, the interconnect and the integrated member are comprised of a same material, and the interconnect and the integrated member have a same width.

9. A capacitive sensor arrangement, comprising:
a capacitive sensor element comprised of a transparent conducting film;
an integrated member residing within a first region of the capacitive sensor element, the integrated member comprised of metal and having a width that is less than approximately 8 micrometers; and
an interconnect coupled to a second region of the capacitive sensor element that is different from the first region, the interconnect configured to carry a flow of current at least one of to the capacitive sensor element and from the capacitive sensor element.

10. The capacitive sensor arrangement of claim 9, wherein the region of the capacitive sensor element includes an interior region having a surface area of the capacitive sensor element, and the integrated member is coupled with the surface area.

11. The capacitive sensor arrangement of claim 9, wherein the capacitive sensor element includes an edge having a surface area of the capacitive sensor element, and the integrated member is coupled to the surface area along the edge.

12. The capacitive sensor arrangement of claim 9, wherein the interconnect and the integrated member are comprised of the metal and has the width that is less than 8 micrometers.

13. A touch input device, comprising:
a substrate;
a first plurality of capacitive sensor elements residing in a capacitive sensor layer on the substrate;
a second plurality of capacitive sensor elements residing in the capacitive sensor layer on the substrate;
one or more first interconnects residing in the capacitive sensor layer, the one or more first interconnects configured to couple the first plurality of capacitive sensor elements to one another;
one or more second interconnects, the one or more second interconnects configured to couple the second plurality of capacitive sensor elements to one another while electrically insulated from the one or more first interconnects and the first plurality of capacitive sensor elements; and one or more integrated members residing within an interior region of each of the capacitive sensor elements of the first plurality of capacitive sensor elements and the second plurality of capacitive sensor elements, the one or more integrated members having a lower resistance to a current than a higher resistance to the current of each of the capacitive sensor elements of the first plurality of capacitive sensor elements and the second plurality of capacitive sensor elements, wherein an integrated member of at least one of the capacitive sensors elements does not directly contact any interconnect coupled to the at least one capacitive sensor element.

14. The touch input device of claim 13, wherein each capacitive sensor element of the first plurality of capacitive sensor elements and the second plurality of capacitive sensor elements includes a border region that surrounds at least a portion of the interior region, and the one or more integrated members extend along a surface area of each capacitive sensor element from the border region into the interior region.

15. The touch input device of claim 13, wherein the capacitive sensor layer is comprised of a transparent conducting film and the one or more integrated members are visually indistinguishable, to a naked eye of a user, from the capacitive sensor elements residing in the capacitive sensor layer.

16. The touch input device of claim 13, wherein the one or more integrated members have a width that is no greater than 8 micrometers.

17. The touch input device of claim 13, wherein the one or more integrated members are comprised of a metal.

18. The touch input device of claim 13, wherein the one or more second interconnects have the lower resistivity to the current.

* * * * *